(12) United States Patent
Faibis et al.

(10) Patent No.: US 7,894,495 B2
(45) Date of Patent: Feb. 22, 2011

(54) POWER STABILIZED LASER DIODE ARRAY

(75) Inventors: Aurel Faibis, Sytrya (IL); Tamir Segev, Moshav Avihail (IL)

(73) Assignee: Eastman Kodak Company, Rochester, NY (US)

( * ) Notice: Subject to any disclaimer, the term of this patent is extended or adjusted under 35 U.S.C. 154(b) by 116 days.

(21) Appl. No.: 12/400,130

(22) Filed: Mar. 9, 2009

(65) Prior Publication Data
US 2010/0226397 A1 Sep. 9, 2010

(51) Int. Cl.
*H01S 3/04* (2006.01)
*H01S 3/13* (2006.01)

(52) U.S. Cl. .............. 372/29.02; 372/29.021; 372/34

(58) Field of Classification Search ............ 372/29.015, 372/29.02, 29.021, 38.07
See application file for complete search history.

(56) References Cited

U.S. PATENT DOCUMENTS

| | | | | |
|---|---|---|---|---|
| 4,378,956 | A | * | 4/1983 | Lester ................. 340/815.42 |
| 6,559,880 | B2 | * | 5/2003 | Ohba ....................... 347/263 |
| 2005/0116666 | A1 | | 6/2005 | Shimizu et al. |
| 2007/0285491 | A1 | * | 12/2007 | Kishimoto ................. 347/233 |
| 2008/0055672 | A1 | * | 3/2008 | Watanabe et al. ........... 358/474 |
| 2009/0028199 | A1 | | 1/2009 | Brown et al. |

* cited by examiner

*Primary Examiner*—Armando Rodriguez
(74) *Attorney, Agent, or Firm*—Nelson Adrian Blish

(57) ABSTRACT

A system for controlling optical-power stability of emitting laser diodes (204), the laser diodes exhibiting temperature changes at the laser diode junctions (312), the temperature changes are predicted according to the laser diodes duty cycle. The system includes, a laser diodes arranged to emit light on a target (14); a data stream analyzer (408) configured to receive incoming data stream (324) analyze the data and produce an image data occurrence factor of larger than zero values (424) representing the data in the incoming data stream (324); and an optical power stabilizer (412) configured to control current intensity (428) applied on a laser diode according to the image data occurrence factor (424).

13 Claims, 4 Drawing Sheets

POWER STABILIZED LASER DIODE ARRAY

FIELD OF THE INVENTION

The present invention relates to an apparatus and method for controlling optical power stability a laser diode array, and more specifically an array of vertical cavity surface emitting lasers (VCSEL).

BACKGROUND OF THE INVENTION

The optical-power generated by a laser-diode is primarily a function of junction temperature and current. During laser-diode operation the junction-temperature increases and the optical-power decreases.

Certain applications, such as computer-to-plate (CTP), require that the optical power is kept constant during the operation of the system. In order to prevent optical power variations, the system should be equipped with the ability to monitor either the optical power or the junction temperature; this will allow applying necessary corrections through appropriate modulation of the current.

Continuous power measurement is not recommended as it disturbs the beam path and accurate temperature measurements of the individual junctions are practically impossible for laser diode arrays. Thus, such measurements cannot be practically used to control the optical power of multiple emitters.

SUMMARY OF THE INVENTION

Briefly, according to one aspect of the present invention an apparatus for controlling optical-power stability of emitting laser diodes, the laser diodes exhibiting temperature changes at the laser diode junctions, the temperature changes are predicted according to the laser diodes duty cycle. The apparatus includes, laser diodes arranged to emit light on a target, a data stream analyzer which is configured to receive incoming data stream and analyze it to produce an image data occurrence factor representing streams of data larger than zero, and an optical power stabilizer configured to control current intensity applied on a laser diode according to the image data occurrence factor.

These and other objects, features, and advantages of the present invention will become apparent to those skilled in the art upon a reading of the following detailed description when taken in conjunction with the drawings wherein there is shown and described an illustrative embodiment of the invention.

BRIEF DESCRIPTION OF THE DRAWINGS

The subject matter regarded as the invention will become more clearly understood in light of the ensuing description of embodiments herein, given by way of example and for purposes of illustrative discussion of the present invention only, with reference to the accompanying drawings (Figures, or simply "FIG."), wherein.

DETAILED DESCRIPTION OF THE INVENTION

In the following detailed description, numerous specific details are set forth in order to provide a thorough understanding of the disclosure. However, it will be understood by those skilled in the art that the teachings of the present disclosure may be practiced without these specific details. In other instances, well-known methods, procedures, components and circuits have not been described in detail so as not to obscure the teachings of the present disclosure.

The present invention discloses a method to estimate changes in junction-temperature based on the mean operation duty-cycle of each laser-diode emitter and of its neighbors.

Figure 1:
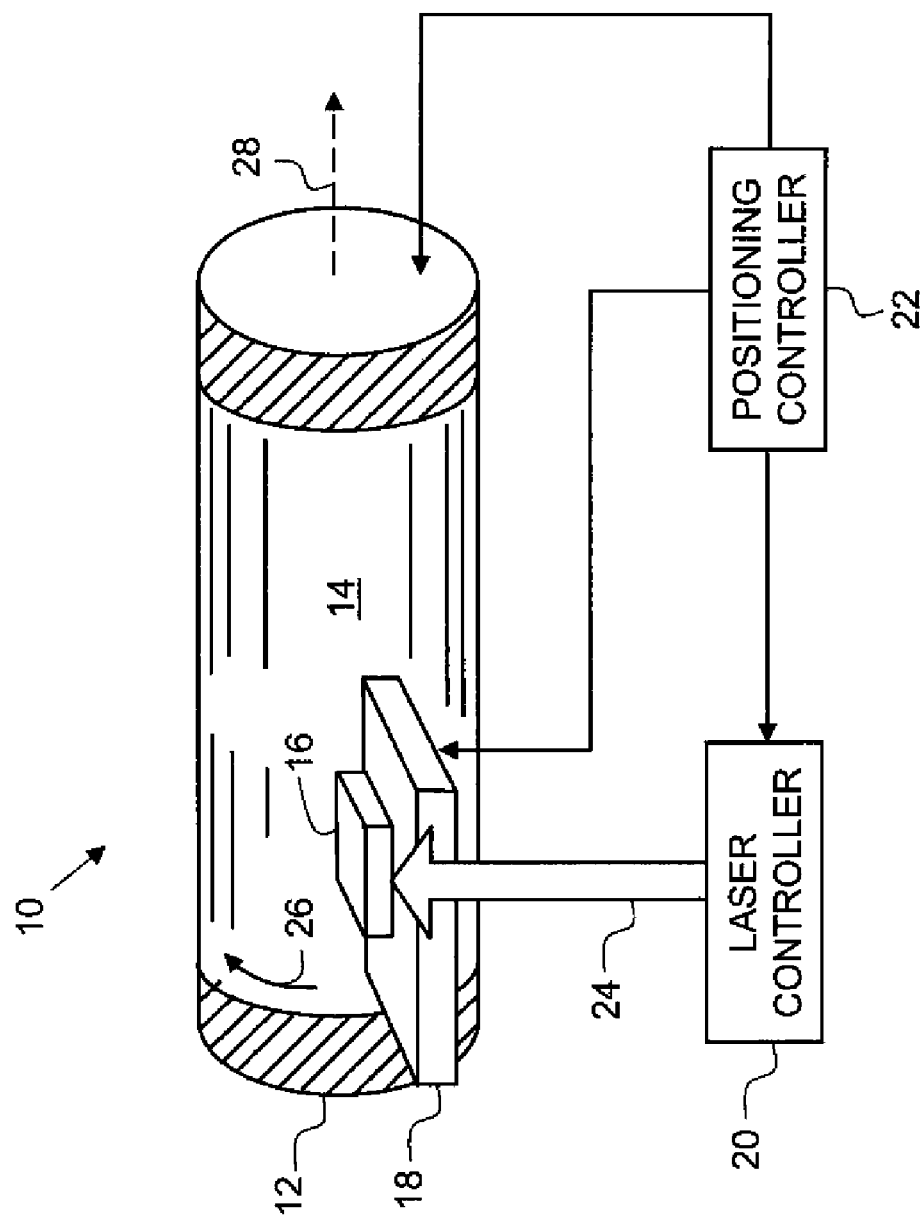
FIG. 1 is a schematic of a computer-to-plate (CTP) imaging head.

FIG. 1 shows a typical laser based CTP imaging system 10, mounted to rotating drum 12. A printing plate 14 is mounted on the drum. As drum 12 rotates under the control of positioning controller 22, plate 14 rotates together. The direction of rotation 26 of drum 12 is called the "fast scan direction". System 10 can be configured, in accordance with the invention, to print in a swath that expands and contracts.

Imaging head 16, which includes an array of lasers, is coupled to optical head 18, which positions imaging head 16 with respect to drum 12. Optical head 18 can move laterally with respect to drum 12. The direction in which optical head 18 can move is the same direction 28 as the axis of rotation of drum 12, and is called the "slow scan direction". Imaging head 16 may print parallel swaths in fast scan direction 26 or slow scan direction 28, but usually imaging head 16 prints swaths helically by printing in fast scan direction 26 and slow scan direction 28 simultaneously.

Positioning controller 22 regulates the rotational speed of drum 12 and the position of optical head 18. By rotating drum 12 and/or moving optical head 18, positioning controller 22 can bring one or more lasers to bear upon substantially any point on the surface of printing plate 14.

Lasers in imaging head 16 are under the control of laser controller 20, and are modulated by image data 24 supplied to laser controller 20. Positioning controller 22 typically sends a ting signal to laser controller 20 so that the correct image data will be supplied to the lasers when the laser array is in the correct position relative to printing plate 14. Laser controller 20 may be, for example, a computer such as a personal computer, a microcomputer or an embedded processor or microcontroller.

Figure 2:
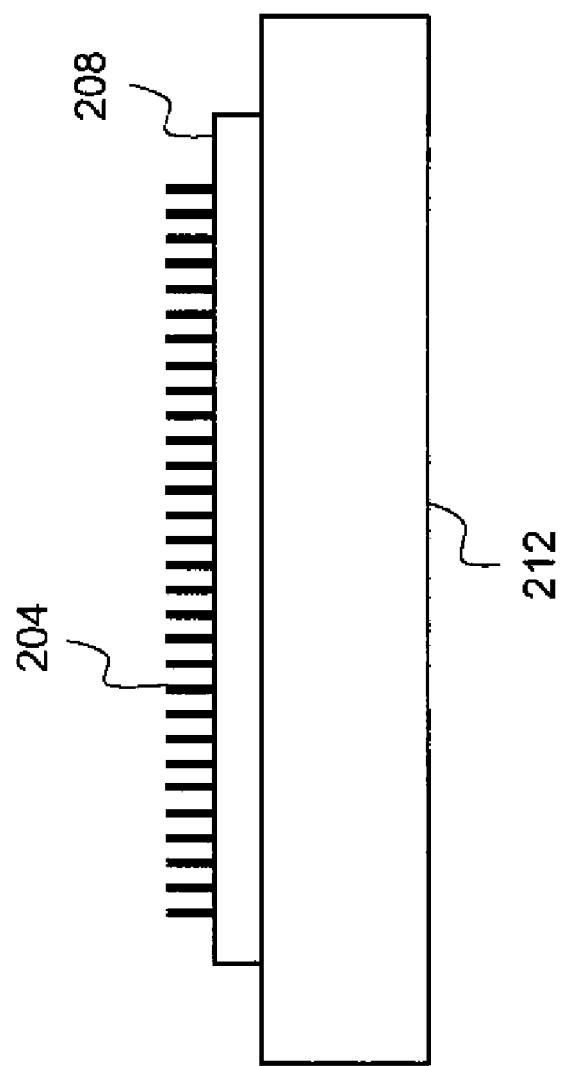
FIG. 2 is a schematic of a laser diode array arranged in a mechanical assembly.

FIG. 2 shows a laser diodes 204 arranged in a mechanical assembly 208 equipped with a cooling element 212 attached to the mechanical assembly 208. The increase in the junction temperature correlates to the digital data content of the exposed image. As the operation time of a relevant laser diode increases, or in other words the number of '0's in the data decreases per a time period per emitter, the temperature at the junction of a specific emitter will increase. The rise in junction temperature causes reduction in the optical power generated by the respective laser diode. In order to stabilize the intensity of emitted light rays it is needed to increase the outgoing current intensity, in order to achieve power intensity stability for the imaging laser diodes, thus resulting in a stable image on the printing plate.

The method comprises several steps:

1. Estimate the temperature change ΔT by, for example, a weighted-average of the emitter duty-cycle state:

$$\Delta T_n = \beta \cdot \Delta T_{n-1} + (1-\beta) \cdot \text{state}_n$$

The parameter $\beta$, $0 < \beta < 1$, is a measure of the longest time-interval that is required by the system in order to release the thermal energy generated by the operating laser diode and stored close to the emitter location.

"$State_n$" represents the image data value in a specific pixel. In the case when $State_n=0$ no laser diode will be invoked to image that pixel on the substrate. For values of $State_n>0$, a laser diode is invoked with a power intensity corresponding to value $State_n$ Certain imaging devices will use only two pixel data values i.e. 'no image data'='0' and 'image data'='1'. Other imaging devices will use plurality pixel data values .e.g. 16 values (0 to 15) or more.

The quantity $\Delta T_n$ is estimated for each emitter separately; $\Delta T_n$ is a measure of the heat absorbed at the junction in time slot n, e.g. one micro second separates between two consecutive time slots. $\Delta T_n$ is proportional to the local temperature change.

Typically, the temperature in the junction reaches back the nominal value about 3 to 4 milliseconds from the time the diode stops operating.

2. Modify the emitter-current to compensate for the effect of the temperature-change. The emitter current is increased by an amount $\Delta I$ proportional to the temperature-change. The proportionality coefficient $\alpha$ is emitter specific.

$$\Delta I = \frac{\frac{d}{dT}P}{\frac{d}{dI}P} \cdot \Delta T = \alpha \cdot \Delta T$$

The above expression indicates that the proportionality coefficient is linear with the ratio between the power-derivative with respect to emitter-temperature and the power-derivative with respect to emitter current.

3. Update current values periodically, preferably, the updates are performed at intervals significantly shorter than the time-interval associated with the parameter $\beta$.

The method can be further developed to compensate for thermal cross-talk between adjacent emitters. In this case the quantity $\Delta T$ is replaced by a weighted sum of the respective $\Delta T$ quantities of the emitter and its immediate neighbors:

$$\Delta T_n = a_{-1} \cdot (\Delta T_n)^{(-1)} + a_0 \cdot (\Delta T_n)^{(0)} + a_1 \cdot (\Delta T_n)^{(1)}$$

The parameters $\beta$ and $\alpha$ may are expected to be wafer dependent; thus, they may require adjustment whenever a particular LDA is replaced with another LDA produced from a different wafer.

Figure 3:
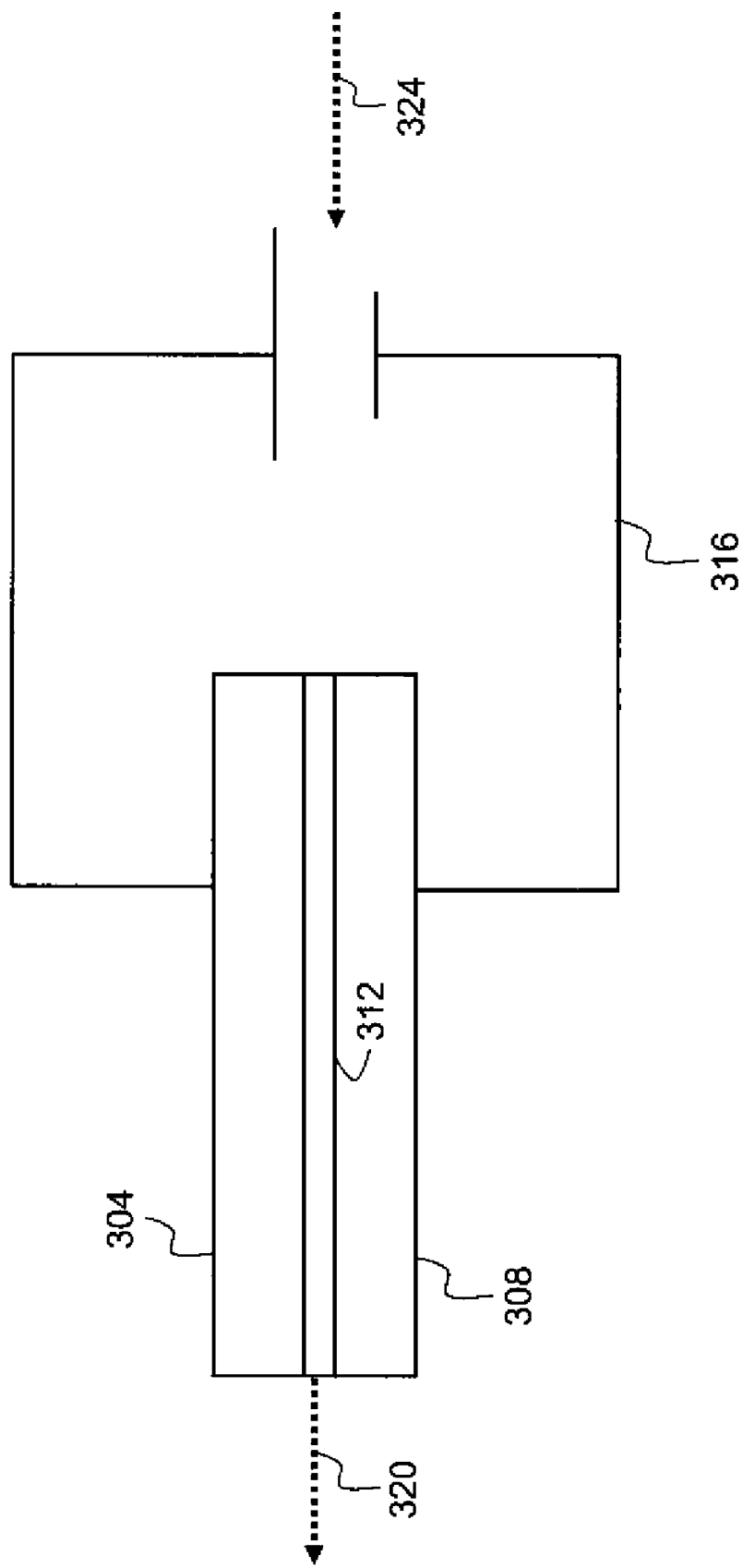
FIG. 3 is a schematic of an electronic current controller for a laser diode array.

In order to achieve power-stability based on the method described herein, correction coefficients $\alpha$ are to be estimated for each of the emitters. A three step procedure is proposed:

a) Each individual emitter is operated for intervals short enough such that the junction-temperature, $T_1$ is much lower compared to the temperature reached in continuous operation. The current is tuned to a certain value $I_1$ necessary to generate a preset optical-power.

b) The same procedure is repeated with each emitter operating for long intervals, such that the junction reaches the temperature $T_2$ associated with continuous operation and the same optical-power is generated for a certain current value $I_2$.

c) Parameter $\alpha$ for each emitter is then estimated according to the formula shown below:

FIG. 3 shows a typical laser diode electrical circuit 316. Image data stream 324 is applied on circuit 316, when the incoming data value is larger than 0 (zero value), the circuit opens and PN junction 312 causes photon 320 to be emitted.

Figure 4:
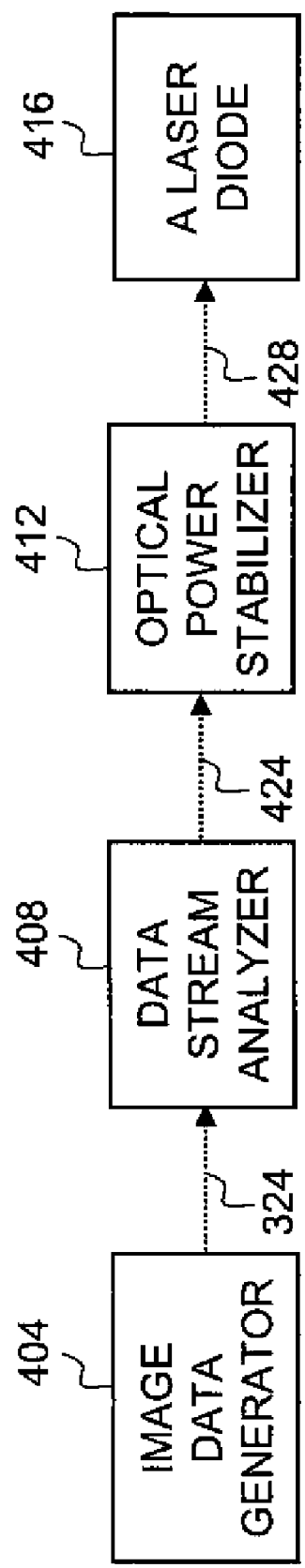
FIG. 4 is a schematic of a block diagram of a laser diode controller according to image data stream.

FIG. 4 shows a block diagram of the method and apparatus. Image data generator 404 supplies an image data stream 324 into a data stream analyzer 408. The image data stream 324 represents an image data to be imaged on plate 14.

Analyzer 408 analyzes data stream 324 and finds the larger than 0 values occurrence factor 424 in data stream 324. Factor 424 is provided to optical power stabilizer 412. Stabilizer 412 controls the current intensity 428 applied on laser diode 416, according to the generated factor 424.

The invention has been described in detail with particular reference to certain preferred embodiments thereof, but it will be understood that variations and modifications can be effected within the scope of the invention.

| PARTS LIST | |
|---|---|
| 10 | imaging system |
| 12 | rotating drum |
| 14 | plate |
| 16 | imaging head |
| 18 | optical head platform |
| 20 | laser controller |
| 22 | positioning controller |
| 24 | image data |
| 26 | fast scan direction |
| 28 | slow scan direction |
| 204 | laser diodes |
| 208 | mechanical assembly for laser diodes |
| 212 | cooling element |
| 304 | P |
| 308 | N |
| 312 | PN junction |
| 316 | electrical circuit |
| 320 | emitted photon |
| 324 | image data stream |
| 404 | image data generator |
| 408 | data stream analyzer |
| 412 | optical power stabilizer |
| 416 | a laser diode |
| 424 | larger than zero value occurrence factor |
| 428 | current intensity |

The invention claimed is:

1. An optical-power stabilized laser diode array comprising:
   a plurality of laser diodes;
   an image data stream which provides image data to each of said laser diodes wherein said image data is represented by three or more values;
   a data stream analyzer for analyzing said image data stream for each laser diode to determine a duty cycle for each laser diode and for calculating a projected temperature change for each laser diode based on said duty cycle; and
   an optical power stabilizer for controlling current applied to each laser diode according to said projected temperature change.

2. A system for controlling optical-power stability of emitting laser diodes, the laser diodes exhibiting temperature changes at the laser diode junctions, wherein the temperature changes are predicted according to the laser diodes duty cycle, the system comprising:
   laser diodes arranged to emit light on a target;
   data stream analyzer configured to receive incoming image data stream wherein said incoming image data is represented by three or more values and wherein said incoming image data stream is analyzed to produce image data occurrence factor of larger than zero values in said data stream; and an optical power stabilizer configured to control current intensity applied on a laser diode according to said image data occurrence factor.

3. A system for controlling optical-power output of an array of emitting laser diodes, wherein temperature changes of the laser diodes affect output power of the laser diodes, the system comprising:

a data stream applied to each laser diode;

a data stream analyzer configured to produce an image data occurrence factor for each laser diode wherein said image data is represented by three or more values; and an optical power stabilizer configured to control current applied to each laser diode according to said image data occurrence factor.

4. The system according to claim 2 wherein said target is a computer-to-plate (CTP) plate system.

5. The system according to claim 1 wherein said image data stream represent an image for imaging on a target.

6. The system according to claim 1 wherein said image data stream represent half tone data.

7. The system according to claim 1 wherein said temperature change is predicted for each of said laser diode according to said image data stream for activating each said laser diode and said image data stream are used for at least one adjacent laser diode.

8. The system according to claim 1 wherein said laser diodes are vertical cavity surface emitting lasers (VCSEL).

9. The system according to claim 2 wherein said data stream analyzer computes plurality of said image data occurrence factor representing the image data to be imaged prior to the imaging process.

10. The system according to claim 1 wherein said data stream analyzer computes said image data occurrence factor on said incoming data stream during the imaging process.

11. The system according to claim 2 wherein said data stream analyzer computes said image data occurrence factor on said incoming data stream during the imaging process.

12. A method for controlling power output of laser diodes wherein the laser diodes exhibiting power changes related to temperature changes at laser diodes junction, wherein the temperature changes are predicted according to the laser diodes duty cycle, the method comprising:

analyzing incoming image data stream wherein said incoming image data is represented by three or more values and wherein said incoming image data stream is analyzed to produce image data occurrence factor of larger than zero values in said data stream per time unit; and adjusting an optical power stabilizer means to control current applied to each laser diode according to said image data occurrence factor.

13. A computer-to-plate (CTP) imaging device comprising a system for controlling power of emitting laser diodes, the laser diodes exhibiting power changes related to temperature changes at laser diodes junctions, wherein the temperature changes are predicted according to the laser diodes duty cycle, the system comprising:

laser diodes arranged to emit light on a target;

a data stream analyzer configured to receive an incoming data stream wherein said incoming image data is represented by three or more values and wherein said incoming data stream is analyzed to produce image data occurrence factor of larger than zero values in said data stream per time unit; and an optical power stabilizer configured to control current applied on a laser diode according to said image data occurrence factor.

* * * * *